(12) United States Patent
Sim et al.

(10) Patent No.: US 8,588,001 B2
(45) Date of Patent: *Nov. 19, 2013

(54) INTEGRATED CIRCUIT MEMORY DEVICES HAVING VERTICALLY ARRANGED STRINGS OF MEMORY CELLS THEREIN AND METHODS OF OPERATING SAME

(75) Inventors: Jae-Sung Sim, Gyeonggi-do (KR); Jung-Dal Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 153 days.

This patent is subject to a terminal disclaimer.

(21) Appl. No.: 13/181,037

(22) Filed: Jul. 12, 2011

(65) Prior Publication Data

US 2011/0266607 A1 Nov. 3, 2011

Related U.S. Application Data

(63) Continuation of application No. 12/492,209, filed on Jun. 26, 2009, now Pat. No. 8,004,893.

(51) Int. Cl.
*G11C 16/04* (2006.01)

(52) U.S. Cl.
USPC ............. 365/185.17; 365/185.02; 365/185.05

(58) Field of Classification Search
USPC ............................ 365/185.02, 185.17, 185.05
See application file for complete search history.

(56) References Cited

U.S. PATENT DOCUMENTS

| | | | |
|---|---|---|---|
| 5,111,428 A | 5/1992 | Liang et al. | ................... 365/104 |
| 5,994,746 A | 11/1999 | Reisinger et al. | |
| 6,151,249 A | 11/2000 | Shirota et al. | ............ 365/185.17 |
| 6,940,122 B2 * | 9/2005 | Yoon | .............................. 257/315 |
| 7,061,042 B2 * | 6/2006 | Lee et al. | ........................ 257/315 |
| 7,177,191 B2 | 2/2007 | Fasoli et al. | ............... 365/185.17 |
| 7,382,018 B2 | 6/2008 | Kim et al. | |

(Continued)

FOREIGN PATENT DOCUMENTS

| | | |
|---|---|---|
| JP | 11-265997 | 9/1999 |
| KR | 1019990067904 A | 8/1999 |

(Continued)

OTHER PUBLICATIONS

Tanaka et al., "Bit Cost Scalable Technology with Punch and Plug Process for Ultra High Density Flash Memory," 2007 Symposium on VLSI Technology Digest of Technical Papers, pp. 14-15.

*Primary Examiner* — Pho M Luu
(74) *Attorney, Agent, or Firm* — Myers Bigel Sibley & Sajovec, P.A.

(57) ABSTRACT

Nonvolatile memory devices include a first NAND-type string of EEPROM cells having a first plurality of string selection transistors therein electrically connected in series within the string. This first plurality of string selection transistors includes a first plurality of depletion-mode transistors and a first enhancement-mode transistor. A second NAND-type string of EEPROM cells is provided with a second plurality of string selection transistors therein that are electrically connected in series. The second plurality of string selection transistors includes a second plurality of depletion-mode transistors and a second enhancement-mode transistor. The first enhancement-mode transistor is stacked vertically relative to one of the second plurality of depletion-mode transistors and the second enhancement-mode transistor is stacked vertically relative to one of the first plurality of depletion-mode transistors. A first string selection plug is configured to electrically connect gate electrodes of the first enhancement-mode transistor and one of the second plurality of depletion-mode transistors.

17 Claims, 9 Drawing Sheets

(56) References Cited

U.S. PATENT DOCUMENTS

| | | | |
|---|---|---|---|
| 7,416,956 B2 * | 8/2008 | Yuan | 438/427 |
| 7,701,771 B2 * | 4/2010 | Jeong et al. | 365/185.18 |
| 7,796,432 B2 | 9/2010 | Kim et al. | 365/185.17 |
| 7,843,733 B2 * | 11/2010 | Kim et al. | 365/185.11 |
| 8,004,893 B2 * | 8/2011 | Sim et al. | 365/185.05 |
| 2007/0165455 A1 | 7/2007 | Park et al. | |

FOREIGN PATENT DOCUMENTS

| | | |
|---|---|---|
| KR | 1020060089547 A | 8/2006 |
| KR | 100673019 B1 | 1/2007 |
| KR | 100707217 B1 | 4/2007 |

* cited by examiner

INTEGRATED CIRCUIT MEMORY DEVICES HAVING VERTICALLY ARRANGED STRINGS OF MEMORY CELLS THEREIN AND METHODS OF OPERATING SAME

REFERENCE TO PRIORITY APPLICATION

This application is a continuation of U.S. patent application Ser. No. 12/492,209, filed Jun. 26, 2009, now U.S. Pat. No. 8,004,893, which application claims priority to Korean Patent Application No. 10-2008-0064067, filed Jul. 2, 2008, the disclosures of which are hereby incorporated herein by reference.

FIELD OF THE INVENTION

The present invention relates to integrated circuit memory devices and methods of operating same and, more particularly, to integrated circuit memory devices having three-dimensional arrays of memory cells therein and methods of operating same.

BACKGROUND

Integrated circuit memory devices include both volatile and non-volatile memory devices. Volatile memory devices, such as dynamic random access memory (DRAM) devices and static random access memory (SRAM) devices, typically lose data stored therein when power supplies to these memory devices are interrupted. In contrast, non-volatile memory devices are configured to retain stored data even in response to power supply interruptions. Accordingly, non-volatile memory devices are typically suitable for environments where power supply interruptions are frequent.

One type of non-volatile memory device includes a flash memory device, which may utilize NAND-type strings of electrically-erasable programmable read-only memory (EEPROM) cells therein. Typical EEPROM cells include floating-gate type cells and charge-trap type cells, which may utilize a combination of charge storage and charge trapping layers therein. Conventional techniques to achieve high levels of data storage include vertical integration techniques. Some of these techniques are disclosed in US 2007/0252201 to Kito et al., entitled "Nonvolatile Semiconductor Memory Device and Manufacturing Method Thereof," and US 2007/0158736 to Arai et al., entitled "Semiconductor Memory Device and Method of Fabricating the Same."

SUMMARY

Integrated circuit memory devices according to embodiments of the present invention include a plurality of strings of memory cell transistors that are stacked vertically relative to each other, on a substrate. These strings of memory cell transistors are electrically connected together by a plurality of word line plugs. In some of these embodiments of the present invention, the plurality of strings of memory cell transistors include at least a first NAND-type string of EEPROM cells and a second NAND-type string of EEPROM cells displaced vertically relative to the first NAND-type string of EEPROM cells. These EEPROM cells may be charge-trap type EEPROM cells, for example. This first NAND-type string of EEPROM cells includes a first semiconductor active layer and the second NAND-type string of EEPROM cells includes a second semiconductor active layer displaced vertically relative to the first semiconductor active layer. The NAND-type strings of EEPROM cells further include a bit line plug that extends vertically through the first and second semiconductor active layers and is electrically connected to a bit line. This bit line plug electrically shorts respective portions of the first and second semiconductor active layers together. A plurality of string selection plugs are also provided. The plurality of string selection plugs extend vertically through the first and second semiconductor active layers.

According to some of these embodiments of the present invention, the first NAND-type string of EEPROM cells includes a first depletion mode transistor, which uses a first of the plurality of string selection plugs as a gate electrode, and a first enhancement-mode transistor, which uses a second of the plurality of string selection plugs as a gate electrode. In addition, the second NAND-type string of EEPROM cells includes a second depletion mode transistor, which uses the second of the plurality of string selection plugs as a gate electrode, and a second enhancement-mode transistor, which uses the first of the plurality of string selection plugs as a gate electrode.

Nonvolatile memory devices according to additional embodiments of the present invention include a first NAND-type string of EEPROM cells having a first plurality of string selection transistors therein electrically connected in series. This first plurality of string selection transistors includes a first plurality of depletion-mode transistors and a first enhancement-mode transistor. A second NAND-type string of EEPROM cells is also provided with a second plurality of string selection transistors therein that are electrically connected in series. The second plurality of string selection transistors includes a second plurality of depletion-mode transistors and a second enhancement-mode transistor. According to these embodiments of the invention, the first enhancement-mode transistor is stacked vertically relative to one of the second plurality of depletion-mode transistors and the second enhancement-mode transistor is stacked vertically relative to one of the first plurality of depletion-mode transistors. Moreover, the first string selection plug is configured to electrically connect a gate electrode of the first enhancement-mode transistor to a gate electrode of one of the second plurality of depletion-mode transistors. Similarly, the second string selection plug is configured to electrically connect a gate electrode of the second enhancement-mode transistor to a gate electrode of one of the first plurality of depletion-mode transistors in the first plurality of string selection transistors.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Hereinafter, exemplary embodiments of the present invention will be described in detail with reference to the accompanying drawings.

Figure 1:
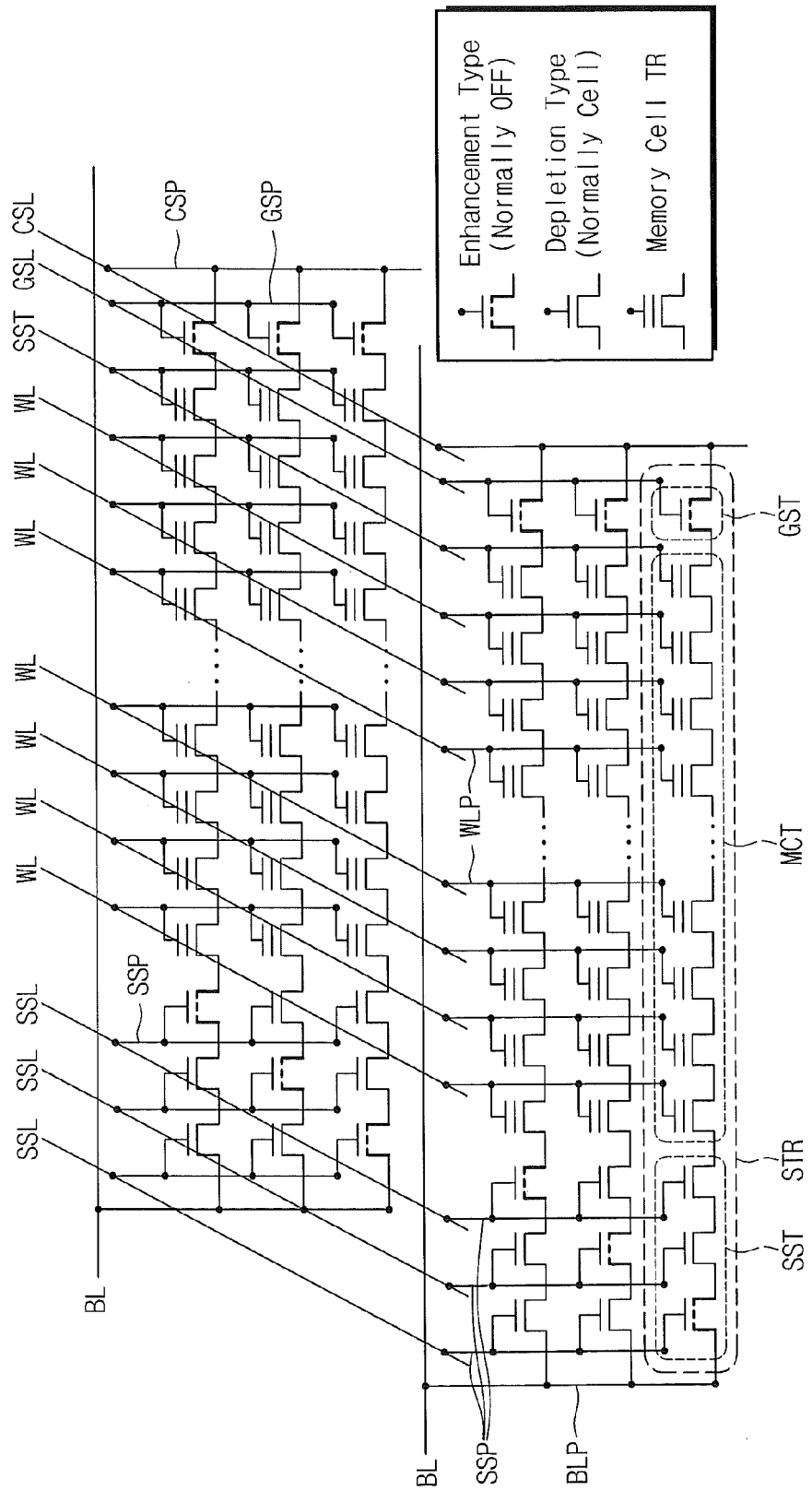
FIG. 1 is a circuit diagram illustrating a three-dimensional semiconductor device according to one embodiment of the present invention.

FIG. 1 is a circuit diagram illustrating a three-dimensional semiconductor device according to one embodiment of the present invention.

Referring to FIG. 1, the semiconductor device may include a plurality of bit lines BL, a plurality of word lines WL crossing over the bit lines BL, a plurality of string selection lines SSL, at least one ground selection line GSL, and at least one common source line CSL.

A bit line plug BLP, which has the major axis penetrating a plane defined by the bit line BL and the word line WL, may be connected to the bit line BL, and a common source plug CSP, which has the major axis parallel to the bit line plug BLP, may be connected to the common source line CSL. That is, the bit line plug BLP and the common source plug CSP are formed to have the major axes that intersect the major axes of the bit line BL and the word line WL.

A plurality of cell strings STR may be connected in parallel between the bit line plug BLP and the common source plug CSP. At this point, each of the cell strings STR includes a plurality of memory cell transistors MCT, a plurality of string selection transistors SST, and at least one ground selection transistor GST. The transistors SST, MCT, and GST constituting the cell string STR are connected in series. In more detail, the string selection transistors SST connects the bit line plug BLP and the memory cell transistor MCT in series, and the ground selection transistor GST is connected in series between the common source plug CSP and the memory cell transistor MCT.

The memory cell transistor MCT may include an information storage layer. The information storage layer may include a charge storage layer. Additionally, according to one embodiment, the number of the string selection transistors SST in one cell string STR may be the same as or may be greater than that of the cell strings STR connected in parallel to one bit line plug BLP. Furthermore, the number of the string selection lines SSL crossing over one cell string STR may be the same as that of the string selection transistors SST in one cell string STR.

According to this embodiment, string selection plugs SSP, word line plugs WLP, and ground selection plugs GSP, parallel to the bit line plug BLP, are respectively connected to the string selection lines SSL, the word lines WL, and the ground selection lines GSL. The string selection plug SSP connects gate electrodes of the string selection transistors SST with the string selection line SSL electrically. The word line plug WLP connects gate electrodes of the memory cell transistors MCT with the word lines WL electrically. The ground selection plug GSP connects gate electrodes of the ground selection transistors GST with the ground selection lines GSL electrically.

As a result, the gate electrodes of the memory cell transistors MCT, which are two-dimensionally arranged on a plane intersecting the bit line BL, are commonly connected to one word line WL. Similarly, the string selection transistors SST and the ground selection transistors GST, which are two-dimensionally arranged on a plane intersecting the bit line BL, are commonly connected to one string selection line SSL and one ground selection line GSL, respectively.

As mentioned above, since the cell strings STR are connected in parallel between the bit line plug BLP and the common source plug CSP, the memory cell transistors MCT included therein are controlled by one bit line plug BLP. Accordingly, when one word line WL and one bit line BL are selected, the memory cell transistors MCT that are connected to the word line plug WLP disposed at an intersection point of the one word line WL and the one bit line BL are selected. According to the present invention, the string selection transistors SST are configured to uniquely select one memory cell from the selected memory cell transistors MCT.

According to one embodiment, as illustrated in the drawings, the string selection transistors SST in one cell string STR may include at least one enhancement mode transistor and at least one depletion mode transistor. As well known, the enhancement mode transistor is a transistor that is in a normally off state, and the depletion mode transistor is a transistor that is in a normally on state. For example, the enhancement mode transistor is a transistor where a channel is not formed when a ground voltage is applied to its gate electrode, and the depletion mode transistor is a transistor having a lower threshold voltage than a ground voltage.

According to one embodiment of the present invention, as illustrated in FIG. 1, one of the string selection transistors SST is the enhancement mode transistor, and the rest of them may be the depletion mode transistors. Furthermore, the distance from the enhancement mode transistor to the bit line plug in the cell string STR may vary according to the distance between a corresponding cell string STR and bit line BL. That is, enhancement mode transistors of the cell strings STR connected to one bit line plug BLP are connected to the respectively different string selection plugs SSP.

According to a modified embodiment of the present invention, the number of the enhancement mode transistors is more than 2. According to a further another modified embodiment of the present invention, the enhancement mode transistor may be used as a memory cell transistor.

Figure 2:
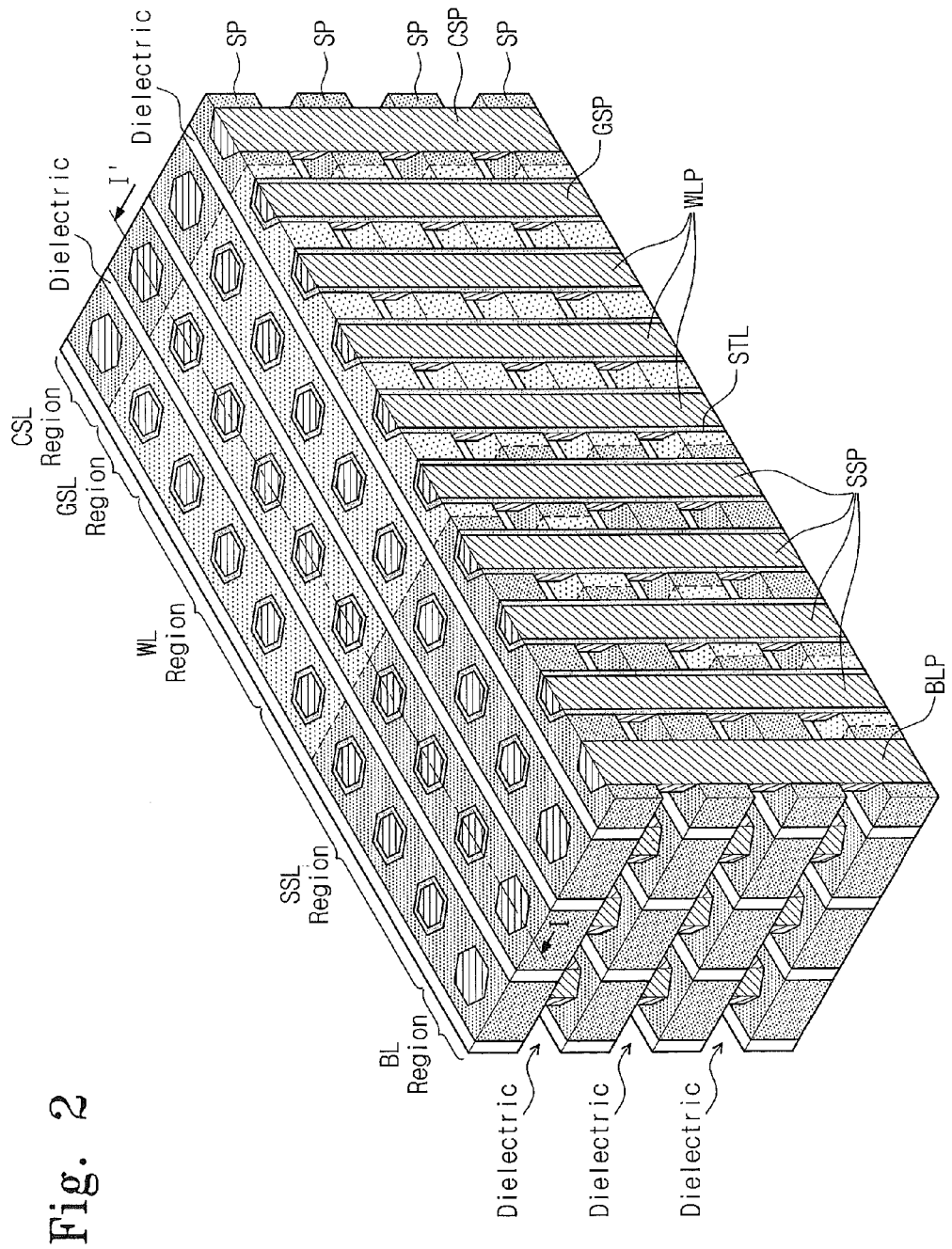
FIG. 2 is a perspective view illustrating a three-dimensional semiconductor device according to one embodiment of the present invention.

FIG. 2 is a perspective view illustrating a three-dimensional semiconductor device according to one embodiment of the present invention. Technical features described with reference to FIG. 1 previously may be omitted for a concise description.

Referring to FIGS. 1 and 2, according to this embodiment, semiconductor patterns SP are three-dimensionally arranged on a substrate. Each of the semiconductor patterns SP is horizontally or vertically spaced apart through a dielectric, to constitute the cell string. That is, the memory cell transistors MCT, the string selection transistors SST, and the ground selection transistor GST may be formed in each of the semiconductor patterns SP.

Plugs penetrating the semiconductor patterns SP are disposed. The plugs may be used as the bit line plug BLP, the common source plug CSP, the word line plug WLP, the string selection plug SSP, and the ground selection plug GSP.

According to one embodiment of the present invention, the bit line plug BLP and the common source plug CSP are formed to directly contact the semiconductor patterns SP, and may be formed of at least one of conductive materials. The bit line plug BLP and the common source plug CSP may include a conductive layer for ohmic-contacting the semiconductor patterns SP. According to one embodiment, the bit line plug BLP and the common source plug CSP may include at least one of doped silicon layers, metal layers, silicide layers, and metal nitride layers.

A gate insulation layer may be interposed between the word line plug WLP, the string selection plug SSP, and the ground selection plug GSP, and the semiconductor patterns SP. Accordingly, they may be used as a gate electrode of a MOS transistor. In more detail, the word line plug WLP, the string selection plug SSP, and the ground selection plug GSP may be used as gate electrodes of the memory cell transistors MCT, the string selection transistors SST, and the ground selection transistors GST, which are connected in series between the bit line plug BLP and the common source plug CSP. The gate insulation layer may include an information storage layer STL. The information storage layer STL may include a tunnel insulation layer, a charge storage layer, and a blocking insulation layer.

According to this embodiment, the semiconductor patterns SP may include regions having respectively different conductive types. For example, a portion adjacent to the word line plugs WLP is a first conductive type, and a portion adjacent to the bit line plug BLP and the common source plug CSP may be a different first conductive type than the second conductive type. A portion of the semiconductor pattern SP adjacent to the ground selection plug GSP may be the first conductive type.

Furthermore, a portion of the semiconductor pattern SP adjacent to the string selection line SSL includes a first conductive type region and a second conductive type region. At this point, the first conductive type region adjacent to the string selection line SSL may vary according to the stacking order of the semiconductor patterns SP. As a result, one enhancement mode transistor may be electrically connected to one string selection plug SSP. Additionally, when a predetermined region adjacent to the string selection line SSL is the second conductive type, a channel is formed even when a ground voltage is applied to the corresponding string selection plug SSP. Therefore, the corresponding string selection transistor constitutes a depletion mode transistor.

Below, referring to FIGS. 3 and 4, a method of fabricating a semiconductor device according to one embodiment of the present invention will be described.

Figure 3:
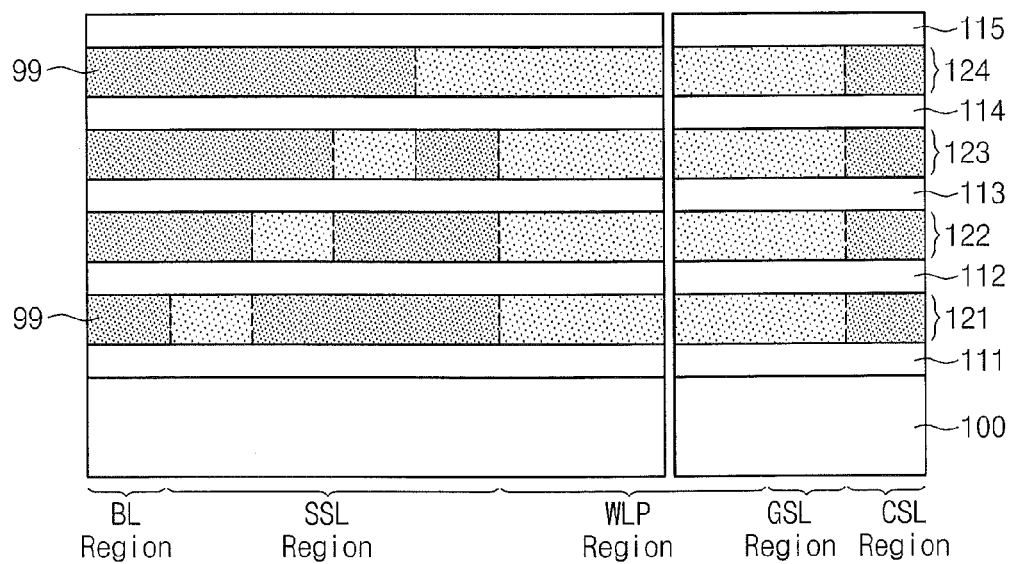
FIGS. 3 and 4 are cross-sectional views illustrating a method of fabricating a semiconductor device according to one embodiment of the present invention.

Referring to FIG. 3, dielectrics 111 to 115 and semiconductor layers 121 to 124 are sequentially and alternately formed on a substrate 100. At this point, the semiconductor layers 121 to 124 may be formed of a semiconductor material (e.g., p-Si) having the first conductive type and may include impurity regions 99 having the second conductive type formed in a predetermined region. The impurity regions 99 may be formed on regions (e.g., a BL region, a CSL region, and a SSL region) where a common source plugs CLP and a string selection plugs SSP are to be formed. At this point, the impurity regions 99 may be formed at respectively different positions in the string selection line SSL region according to the stacking order of the semiconductor layers 121 to 124.

According to one embodiment of the present invention, the impurity regions 99 may be formed through an ion implantation process using a predetermined ion mask. At this point, as mentioned above, in order to form the impurity regions 99 at respectively different positions in the string selection line SSL region, the ion implantation process may be performed many times through respectively different ion masks after the semiconductor layers 121 to 124 are formed.

Figure 4:
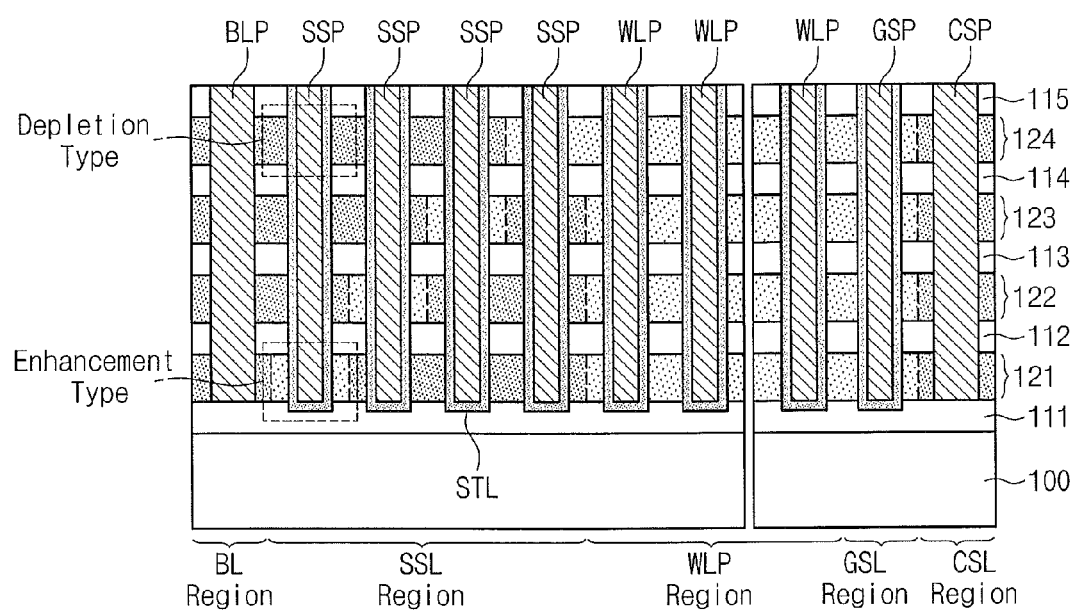

Referring to FIG. 4, by patterning the semiconductor layers 121 to 124 and the dielectrics 111 to 115, as illustrated in FIG. 2, a trench (not shown) is formed to define the horizontally separated semiconductor patterns 126 to 129. Then, the trench is filled with a dielectric.

After holes penetrating the semiconductor patterns 126 to 129 are formed, plugs are formed to fill the holes. According to one embodiment, the forming of the plugs includes conformally forming an information storage layer STL to cover the inner wall of the holes, forming a first conductive material to fill the remaining space of the holes having the information storage layer STL, and spatially separating the plugs through a planarization etch process. These plugs may be used as the word line plugs WLP, the string selection plugs SSP, and the ground selection plugs GSP.

Process for forming the bit line plug BLP and the common source plug CSP may be further performed. This process may include filling the holes with a second conductive material in the bit line BL region and the common source line CSL region after removing the first conductive material and the information storage layer STL.

According to a modified embodiment, after the forming of the information storage layer STL, the information storage layer STL can be selectively removed in the bit line BL region and the common source line CSL region. In this case, the plugs are formed of the first conductive material.

According to a further another embodiment of the present invention, the forming of the holes may be completed through the forming of the trench. That is, the holes and the trench may be substantially formed at the same time.

Figure 5:
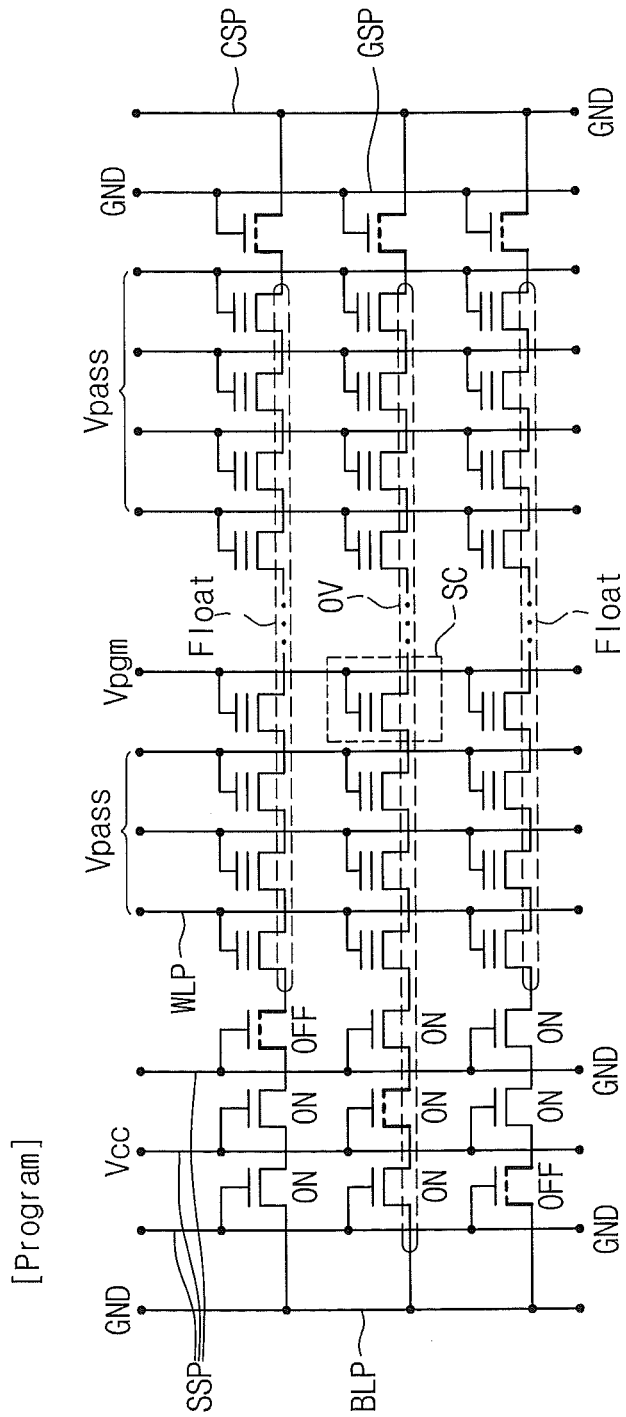
FIGS. 5 through 7 are views illustrating a method of operating a semiconductor device according to one embodiment of the present invention.
Figure 6:
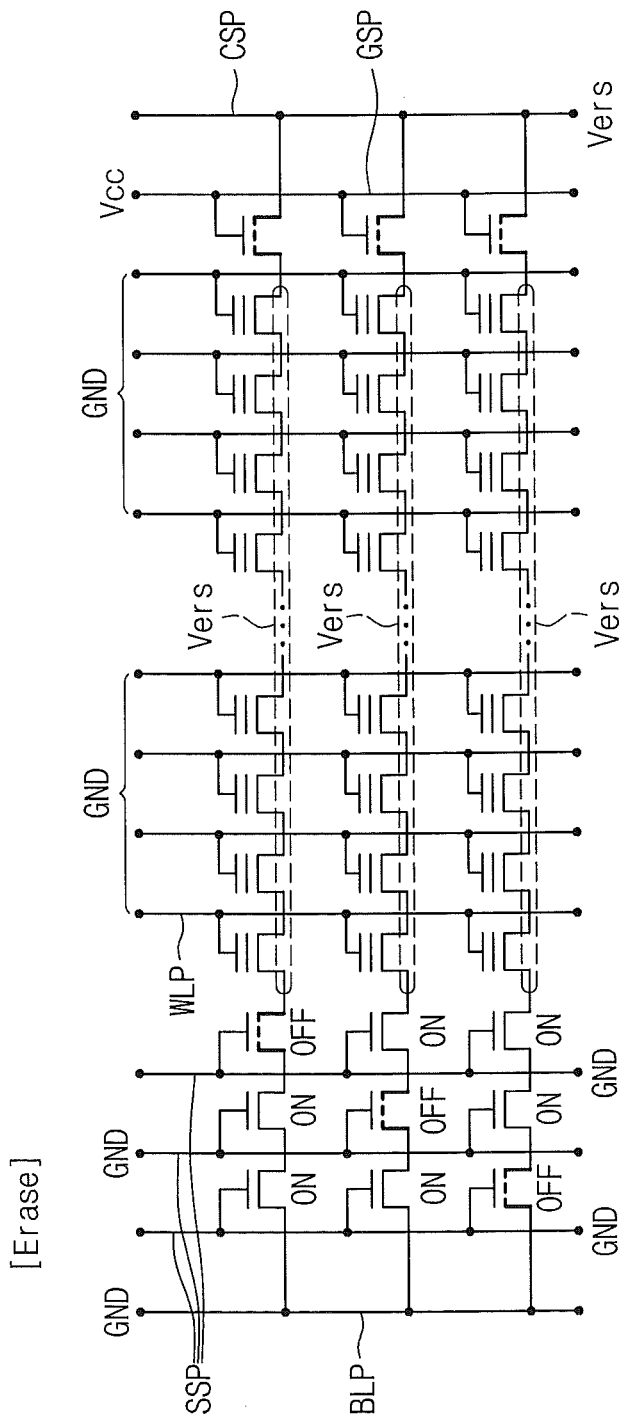
Figure 7:
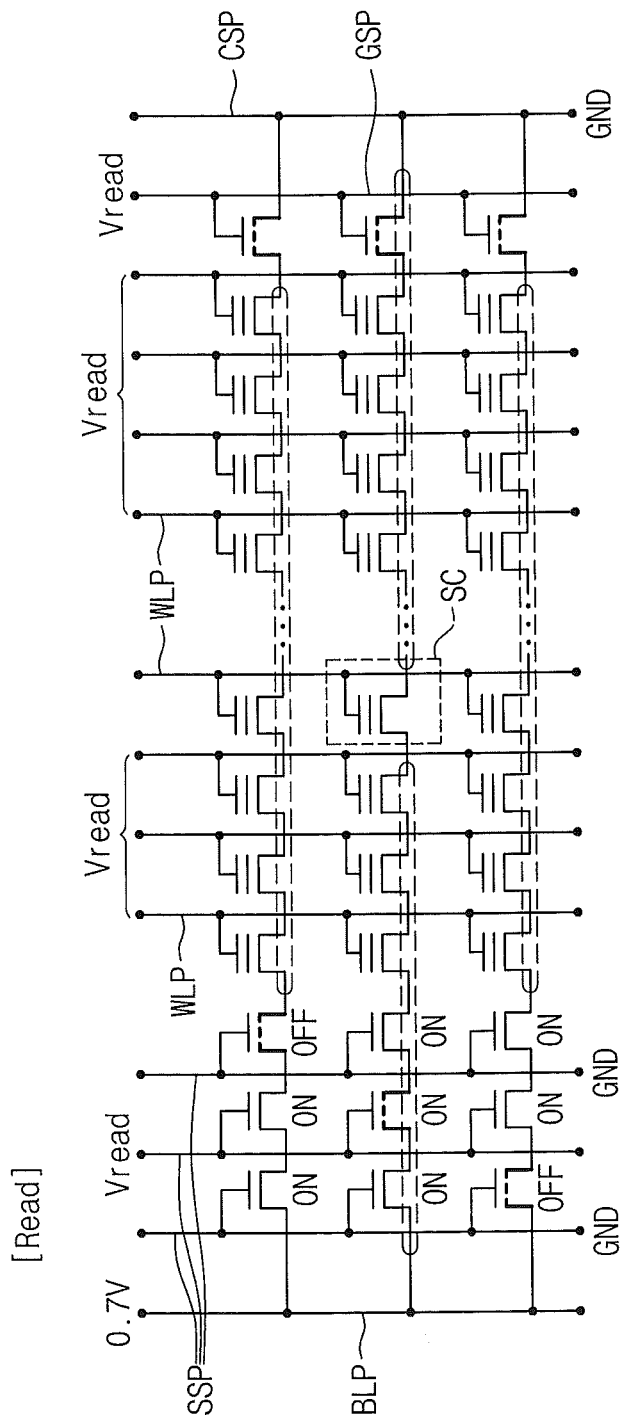

FIGS. 5 through 7 are views illustrating a method of operating a semiconductor device according to one embodiment of the present invention. In more detail, FIGS. 5 through 7 are views illustrating program, erase, and read operations, respectively.

Referring to FIG. 5, the program operation includes a selective connection operation for uniquely selecting one of cell strings connected in parallel to the bit line plug BLP. The selective connection operation may include turning on an enhancement mode string selection transistor in the selected cell string. For example, as illustrated in the drawing, a higher voltage (e.g., a supply voltage) than a threshold voltage of the enhancement mode string selection transistor may be applied to a string selection plug (hereinafter, referred to as a selected string selection plug) connected to the enhancement mode string selection transistor of the selected cell string. In this case, all the string selection transistors connected to the corresponding string selection plug SSP are turned on.

To cut off a current path of an unselected cell string, a lower voltage (e.g., a ground voltage) than a threshold voltage of the enhancement mode string selection transistor is applied to selection plugs (hereinafter, referred to as an, unselected string selection plug) except for the selected string selection plug. At this point, since the enhancement mode string selection transistors connected to the unselected string selection plug are in an off state, an electrical connection may be cut off between the memory cells of the unselected cell string and the bit line plug BLP.

The program operation includes applying a program voltage Vpgm to the selected word line plug and applying a pass voltage Vpass to the unselected word line plugs. The program voltage Vpgm may be selected within a range that causes Fowler-Nodheim tunneling to occur from the semiconductor pattern SP toward the information storage layer pattern STL in the selected memory cell transistor SC. The pass voltage Vpass may be selected within a voltage range lower than the program voltage Vpgm, and higher than threshold voltages of the memory cell transistors.

Furthermore, the program operation may include applying a ground voltage GND to the bit line plug BLP and the ground selection plug GSP. In this case, the ground voltage GND applied to the bit line plug BLP is delivered to the selected cell string, and then applied to one end of the information storage layer pattern of the selected memory cell transistor SC. The Fowler-Nodheim tunneling may effectively occur through a potential difference between the program voltage Vpgm and the ground voltage GND.

Through the selective connection operation, the unselected cell strings are electrically insulated from the bit line plug BLP in order for boosting such that an unintentional program operation for the memory cells of the unselected cell string can be prevented.

Referring to FIG. 6, the erase operation may include applying an erase voltage Vers to the common source plug CSP, applying a ground voltage GND to the word line plugs WLP, and applying a voltage to the ground selection plug GSP to turn on the ground selection transistor. In this case, all the memory cells in the memory cell strings may be simultaneously erased through the Fowler-Nodheim tunneling.

Referring to FIG. 7, the read operation may be completed through the selective connection operation described with reference to FIG. 5. According to one embodiment, by applying a higher read voltage than a threshold voltage of the enhancement mode string selection transistor to the selected string selection plug, the selected cell string is connected to the bit line plug BLP. At this point, by applying a lower voltage (e.g., a ground voltage) than a threshold voltage of the enhancement mode string selection transistor to the unselected string selection plug, the unselected cell strings are electrically disconnected from the bit line plug BLP.

Furthermore, the read operation further includes applying respectively different voltages to the bit line plug BLP and the common source plug CSP in order to create a potential difference therebetween. In this case, according to information stored in the selected memory cell SC, the amplitude of a current passing through the bit line plug BLP may vary. This variation of the current amplitude can be read in a sense amp.

Figure 8:
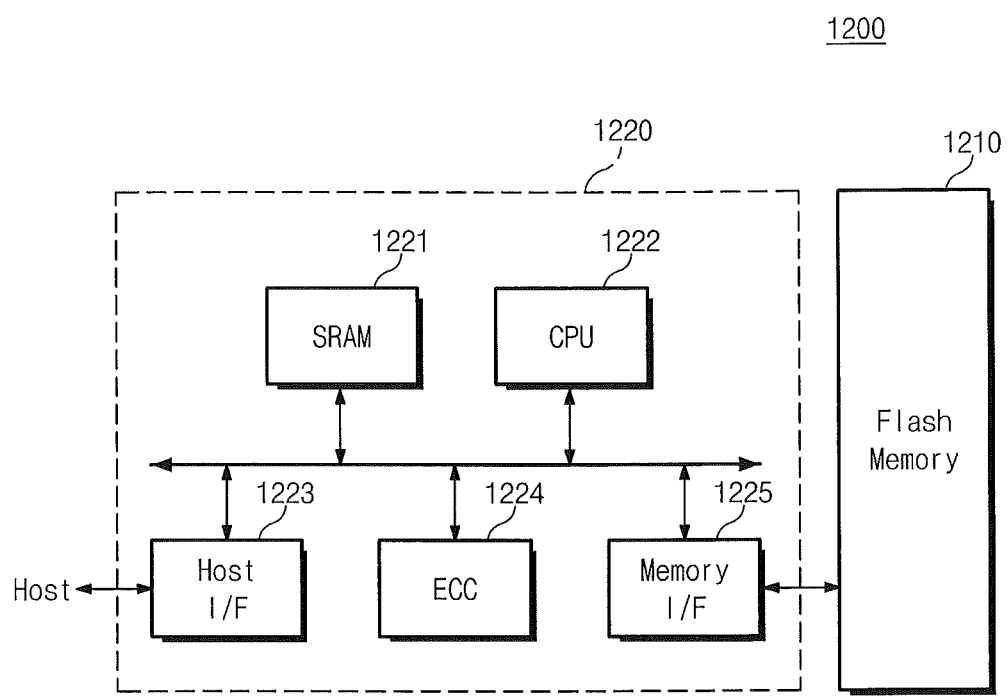
FIG. 8 is a block diagram illustrating one example of a memory card including a flash memory device according to the present invention.

FIG. 8 is a block diagram illustrating one example of a memory card 1200 including a flash memory device according to the present invention. Referring to FIG. 8, the memory card 1200 for supporting a high capacity of data storage includes a flash memory device 1210 according to the present invention. The memory card 1200 includes a memory controller 1220 for general data exchange between a host and the flash memory device 1210.

SRAM 1221 is used as an operating memory of a central processing unit (CPU) 1222. A host interface (I/F) 1223 includes a data exchange protocol of a host connected to the memory card 1200. An error correction code (ECC) 1224 detects and corrects an error included in data read from the multi-bit flash memory device 1210. A memory interface (I/F) 1225 may interface with the flash memory device 1210 of the present invention. The CPU 1222 performs general control operations for data exchange of the memory controller 1220. Although not illustrated in the drawings, it is apparent to those skilled in the art that the memory card 1200 may further include ROM (not shown) for storing code data to interface with the host.

According to a flash memory device, a memory card, or memory system, a more reliable memory system can be provided through the flash memory device 1210 having the improved erasing characteristic of dummy cells. Especially, the flash memory device of the present invention such as a recent solid state disk (SSD), which is actively under developments, may be provide in the memory system. In this case, errors caused from dummy cells can be prevented to realize a highly reliable memory system.

Figure 9:
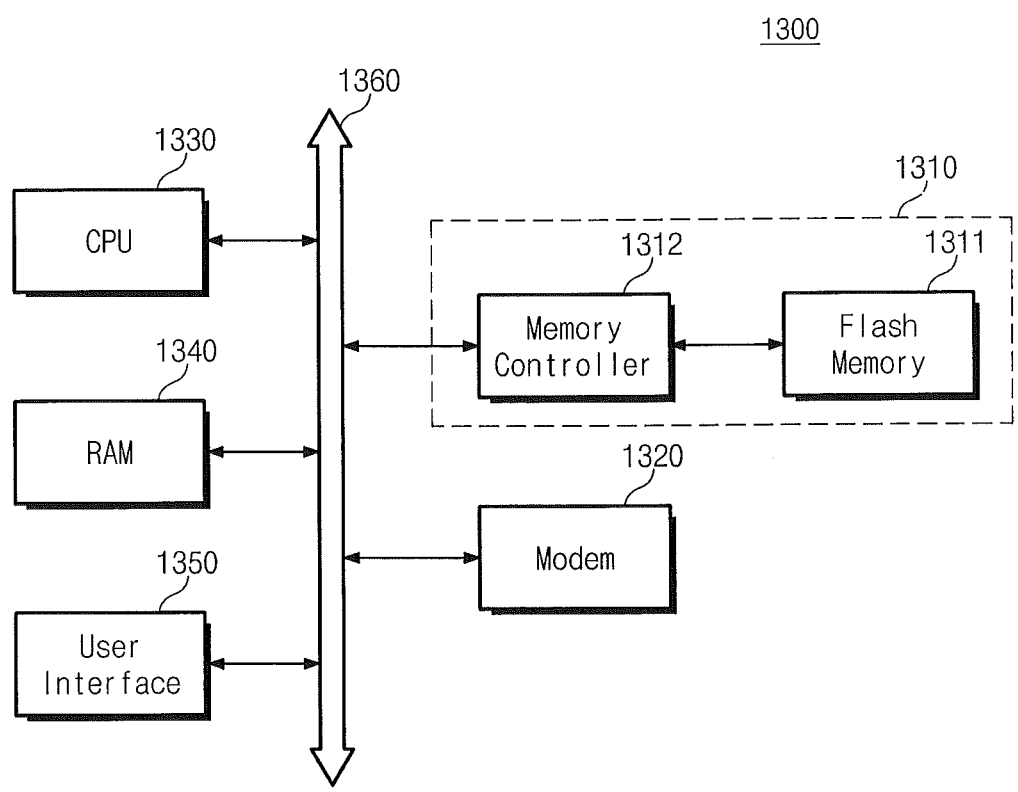
FIG. 9 is a block diagram illustrating an information processing system including a flash memory system according to the present invention.

FIG. 9 is a block diagram illustrating an information processing system 1300 including a flash memory system 1310 according to the present invention. Referring to FIG. 9, the flash memory system 1310 is mounted in the information processing system 1310 such as a mobile device or a desktop computer. The information processing system 1300 according to the present invention includes a modem 1320 connected to the flash memory system 1310 via a system bus 1360, CPU 1330, RAM 1340, and a user interface 1350. The flash memory system 1310 may substantially have the same configuration as the above-mentioned memory system or flash memory system. The flash memory system 1310 stores data processed by the CPU 1330 or data inputted from the external. Here, the flash memory system 1310 includes SSD. In this case, the information process system 1300 can stably store high capacity data in the flash memory system 1310. As its reliability is increased, the flash memory system 1310 may save a resources consumed for an error correction process and thus provides a high speed of data exchange function to the information processing system 1300. Although not illustrated in the drawing, it is apparent to those skilled in the art that the information processing system 1300 may further include an application chipset, a camera image processor (CIS), and an input/output device.

The flash memory device or the memory system according to the present invention may be mounted using various kinds of packages. Examples of the various packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP), wafer-level processed stack package (WSP), etc.

According to the present invention, a plurality of selection transistors are disposed between an interconnection and each of cell strings connected in parallel to the interconnection. The selection transistors may include at least one depletion mode transistor and at least one enhancement mode transistor. By using a difference in a threshold voltage between the depletion and enhancement mode transistors, only one of cell strings connected in parallel to the interconnection can be uniquely selected.

Stated alternatively, and as illustrated and described hereinabove, an integrated circuit memory device includes a plurality of strings of memory cell transistors (STR) that are stacked vertically relative to each other, as illustrated by FIGS. 1-2. These strings of memory cell transistors are electrically connected together by a plurality of word line plugs (WLP). The plurality of strings of memory cell transistors include at least a first NAND-type string of EEPROM cells and a second NAND-type string of EEPROM cells displaced vertically relative to the first NAND-type string of EEPROM cells. These EEPROM cells may be charge-trap type EEPROM cells that utilize respective information storage layers (STLs) surrounding portions of the vertical word line plugs (WLP). The first NAND-type string of EEPROM cells includes a first semiconductor active layer (e.g., stripe-shaped semiconductor layer) and the second NAND-type string of EEPROM cells includes a second semiconductor active layer displaced vertically relative to the first semiconductor active layer. As shown by FIG. 2, which illustrates a plurality of side-by-side stacks of four NAND-type strings separated by respective dielectric layers, the NAND-type strings of EEPROM cells further include a bit line plug (BLP) that extends vertically through the first and second semiconductor active layers and is electrically connected to a bit line (BL). This bit line plug (BLP) electrically shorts respective portions of the first and second semiconductor active layers together. A plurality of string selection plugs (SSP) are also provided. The plurality of string selection plugs (SSP) extend vertically through the first and second semiconductor active layers.

As further illustrated by FIGS. 1-4, the nonvolatile memory device includes a first NAND-type string of EEPROM cells having a first plurality of string selection transistors therein electrically connected in series. This first plurality of string selection transistors includes a first plurality of depletion-mode transistors (shown as three depletion mode transistors in FIGS. 2 and 4) and a first enhancement-mode transistor. A second NAND-type string of EEPROM cells is also provided with a second plurality of string selection transistors therein that are electrically connected in series. The second plurality of string selection transistors includes a second plurality of depletion-mode transistors (shown as three depletion mode transistors in FIGS. 2 and 4) and a second enhancement-mode transistor. The first enhancement-mode transistor is stacked vertically relative to one of the second plurality of depletion-mode transistors and the second enhancement-mode transistor is stacked vertically relative to one of the first plurality of depletion-mode transistors. Moreover, the first string selection plug (SSP) is configured to electrically connect a gate electrode of the first enhancement-mode transistor to a gate electrode of one of the second plurality of depletion-mode transistors. Similarly, the second string selection plug (SSP) is configured to electrically connect a gate electrode of the second enhancement-mode transistor to a gate electrode of one of the first plurality of depletion-mode transistors in the first plurality of string selection transistors.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit memory device, comprising:
    a plurality of strings of memory cell transistors stacked vertically relative to each other, on a substrate; and
    a plurality of word line plugs extending vertically through said plurality of strings of memory cell transistors;
    wherein said plurality of strings of memory cell transistors comprises a first NAND-type string of EEPROM cells and a second NAND-type string of EEPROM cells displaced vertically relative to the first NAND-type string of EEPROM cells;
    wherein said first NAND-type string of EEPROM cells comprises a first semiconductor active layer and said second NAND-type string of EEPROM cells comprises a second semiconductor active layer displaced vertically relative to the first semiconductor active layer.

2. The memory device of claim 1, further comprising a bit line plug that extends vertically through the first and second semiconductor active layers and electrically shorts respective portions of the first and second semiconductor active layers together.

3. The memory device of claim 2, further comprising a plurality of string selection plugs extending vertically through the first and second semiconductor active layers.

4. The memory device of claim 3, wherein the first NAND-type string of EEPROM cells comprises:
    a first depletion mode transistor that uses a first of the plurality of string selection plugs as a gate electrode; and
    a first enhancement-mode transistor that uses a second of the plurality of string selection plugs as a gate electrode.

5. The memory device of claim 4, wherein the second NAND-type string of EEPROM cells comprises:
    a second depletion mode transistor that uses the second of the plurality of string selection plugs as a gate electrode; and
    a second enhancement-mode transistor that uses the first of the plurality of string selection plugs as a gate electrode.

6. The memory device of claim 1, wherein the EEPROM cells are charge-trap type EEPROM cells.

7. An integrated circuit memory device, comprising:
    a plurality of strings of memory cell transistors stacked vertically relative to each other, on a substrate; and
    a plurality of word line plugs extending vertically through said plurality of strings of memory cell transistors;
    wherein a first of said plurality of strings of memory cell transistors comprises a first semiconductor active layer and a second of said plurality of strings of memory cell transistors comprises a second semiconductor active layer.

8. The memory device of claim 7, further comprising a bit line plug that extends vertically through the first and second semiconductor active layers and electrically shorts respective portions of the first and second semiconductor active layers together.

9. The memory device of claim 8, further comprising a plurality of string selection plugs extending vertically through the first and second semiconductor active layers.

10. The memory device of claim 9, wherein the first string of memory cell transistors comprises:
    a first depletion mode transistor that uses a first of the plurality of string selection plugs as a gate electrode; and
    a first enhancement-mode transistor that uses a second of the plurality of string selection plugs as a gate electrode.

11. The memory device of claim 10, wherein the second string of memory cell transistors comprises:
    a second depletion mode transistor that uses the second of the plurality of string selection plugs as a gate electrode; and
    a second enhancement-mode transistor that uses the first of the plurality of string selection plugs as a gate electrode.

12. An integrated circuit memory device, comprising:
    a plurality of strings of memory cell transistors stacked vertically relative to each other, on a substrate; and
    a plurality of word line plugs extending vertically through said plurality of strings of memory cell transistors, the word line plugs substantially vertical to a top surface of the substrate.

13. The memory device of claim 12, further comprising a bit line plug and a common source line plug spaced apart from each other on a substrate, wherein the plurality of cell strings connected in parallel between the bit line plug and the common source plug.

14. The memory device of claim 12, wherein a first of said plurality of strings of memory cell transistors comprises a first semiconductor active layer and a second of said plurality of strings of memory cell transistors comprises a second semiconductor active layer.

15. The memory device of claim 12, further comprising a plurality of string selection plugs extending vertically through the first and second semiconductor active layers.

16. The memory device of claim 15, wherein the first string of memory cell transistors comprises:
- a first depletion mode transistor that uses a first of the plurality of string selection plugs as a gate electrode; and
- a first enhancement-mode transistor that uses a second of the plurality of string selection plugs as a gate electrode.

17. The memory device of claim 15, wherein the second string of memory cell transistors comprises:
- a second depletion mode transistor that uses the second of the plurality of string selection plugs as a gate electrode; and
- a second enhancement-mode transistor that uses the first of the plurality of string selection plugs as a gate electrode.

* * * * *